(12) United States Patent
Yamada

(10) Patent No.: US 6,492,074 B2
(45) Date of Patent: Dec. 10, 2002

(54) MASK FOR ELECTRON BEAM DRAWING UTILIZING AUXILIARY PATTERNS THAT DO NOT BORE THROUGH THE SUBSTRATE

(75) Inventor: Yasuhisa Yamada, Tokyo (JP)

(73) Assignee: NEC Corporation, Tokyo (JP)

( * ) Notice: Subject to any disclaimer, the term of this patent is extended or adjusted under 35 U.S.C. 154(b) by 28 days.

(21) Appl. No.: 09/848,124

(22) Filed: May 3, 2001

(65) Prior Publication Data
US 2001/0044055 A1 Nov. 22, 2001

(30) Foreign Application Priority Data

May 17, 2000 (JP) ........................................ 2000-144349

(51) Int. Cl.$^7$ ................................................. G03F 9/00
(52) U.S. Cl. ............................ 430/5; 430/296; 430/942
(58) Field of Search ............................ 430/5, 296, 942

(56) References Cited

FOREIGN PATENT DOCUMENTS

JP          2000068180    *  8/1998

* cited by examiner

Primary Examiner—Christopher G. Young
(74) Attorney, Agent, or Firm—Katten, Muchin, Zavis, Rosenman

(57) ABSTRACT

An electron beam drawing mask comprises a substrate for damping an electron beam to a predetermined quantity of electrons while the electron beam passes through the substrate, a metallic film formed on at least one surface of the substrate for interrupting the electron beam, a main pattern constituted by openings bored through the substrate and the metallic film, and an auxiliary pattern formed near the main pattern and constituted by window portions where the metallic film has been removed to expose the substrate.

4 Claims, 2 Drawing Sheets

MASK FOR ELECTRON BEAM DRAWING UTILIZING AUXILIARY PATTERNS THAT DO NOT BORE THROUGH THE SUBSTRATE

BACKGROUND OF THE INVENTION (i) Field of the Invention

The present invention relates to electron beam drawing masks, particularly to electron beam drawing masks including means for compensating proximity effect.

(ii) Description of the Related Art

An electron beam exposure method is an exposure technique in which an electron beam is moved on a resist to scan, thereby directly drawing a circuit pattern. Using this electron beam exposure method, a pattern on a scale of 0.1 μm or less can be drawn with high resolution and high accuracy. For this reason, such an electron beam exposure method is widely used for fine processing, e.g., for pattern formations of photomasks or the like, or wiring formations on semiconductor devices.

In the electron beam exposure method, however, the electron beam having entered a resist film may collide with atoms constituting the resist film so that the beam may be scattered forward. In addition, the electron beam having passed through the resist film may collide with heavy atoms constituting a semiconductor substrate or a wiring pattern so that the beam may be scattered backward. As a result, the forward- or backward-scattered electrons are applied to a resist film area around a target area to be irradiated with the electron beam. This causes a phenomenon that a corner of the drawn pattern is rounded, or a phenomenon that the dimensional accuracy of the pattern is deteriorated due to the variation of pattern density. These phenomena are called "proximity effect" because they are apt to appear in general at where the pattern has a narrow interval.

Particularly in case that a wiring pattern or the like made of a material having a high backward scattering coefficient, such as tungsten or molybdenum, is formed as the underlayer of the resist film, proximity effect due to backward-scattered electrons may appear remarkably. Thus, to improve the dimensional accuracy of a pattern in the electron beam exposure method, a proximity effect compensation is required wherein, prior to the irradiation with an electron beam, a calculation is made by a simulation taking the influence of proximity effect into consideration, and thereby the exposure quantity with the electron beam is regulated in advance.

For this proximity effect compensation, the following methods are known: (1) methods wherein the distribution of energy accumulated in the resist film by the electron beam is calculated by a simulation, and, in accordance with the calculated result, a pattern different in shape from a designed objective pattern is made in the mask so as to compensate proximity effect upon actual drawing (mask bias or the like); (2) methods wherein, after a normal pattern drawing operation, separate auxiliary exposure is done to compensate the shortage of energy caused by proximity effect; and (3) methods wherein auxiliary exposure is done using a mask having a membrane structure, as represented by a scalpel ghost method.

Of the above-mentioned proximity effect compensation methods, methods wherein a pattern different in shape from an objective device pattern will be described with reference to FIG. 2. FIG. 2 illustrates a conventional electron beam drawing mask pattern for compensating proximity effect, wherein a device pattern on design is shown in the left part of FIG. 2 and a pattern actually made in a mask is shown in the right part of FIG. 2.

FIG. 2 shows two methods for compensating proximity effect. The upper side in FIG. 2 shows a method wherein, referring to a simulation result of the distribution of accumulated energy of an electron beam, a pattern 9 different in size from a device pattern 1 is made in a mask 10 so that the resist pattern after exposure and development may become the same as the designed pattern. According to this method, proximity effect can be compensated without separately performing auxiliary exposure for compensating the shortage of energy due to proximity effect.

On the other hand, the lower side in FIG. 2 shows a method wherein an auxiliary pattern is added to the device pattern 1 at its circumferential portions for compensating proximity effect. This method corresponds to a technique disclosed in Japanese Patent Application Laid-open No. 2000-68180. According to this technique, fine auxiliary slits 8 for compensating proximity effect are provided at the outermost corner portions of the device pattern 1 to be drawn. Each slit 8 has its width that allows a quantity of electrons, which does not exceed the resolution limit of the resist, to pass through the slit. Auxiliary exposure to the extent of backward scattering diameter is thereby done to compensate proximity effect at the corner portions of the device pattern 1.

In the method of the upper side in FIG. 2, however, because the pattern 9 different in size from the designed pattern must be made in the mask 10, the compare check of the on-mask pattern with the designed pattern can not effectively be done and so the defect check becomes difficult. Besides, there may arise further problems that the data quantity becomes large, a long time is required for making the mask, and the cost increases.

On the other hand, in the method of the lower side in FIG. 2, because fine auxiliary stilts 8 in accordance with an estimation of proximity effect must be provided in the mask 10, in order that such fine auxiliary stilts 8 themselves cannot be resolvable, a complex pattern finer in comparison with the design rule must be formed. This may require processing accuracy higher than that when the original pattern as designed is formed. There arises a problem that it becomes difficult to make the mask.

Besides, the methods wherein separate auxiliary exposure is done to compensate the shortage of energy caused by proximity effect may bring about a decrease in throughput by the time required for the auxiliary exposure process. Further, in the methods wherein auxiliary exposure is done using a mask having a membrane structure, there may arise a problem of deterioration of contrast.

SUMMARY OF THE INVENTION

It is an object of the present invention to provide electron beam drawing masks capable of effectively compensating proximity effect without forming any complex pattern finer than a device pattern.

An electron beam drawing mask according to the present invention comprises: a substrate for damping an electron beam to a predetermined quantity of electrons while the electron beam passes through the substrate; a metallic film formed on at least one surface of the substrate for interrupting the electron beam; a main pattern constituted by at least one opening bored through the substrate and the metallic film; and an auxiliary pattern formed near the main pattern and constituted by at least one window portion where the metallic film has been removed to expose the substrate.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1A:
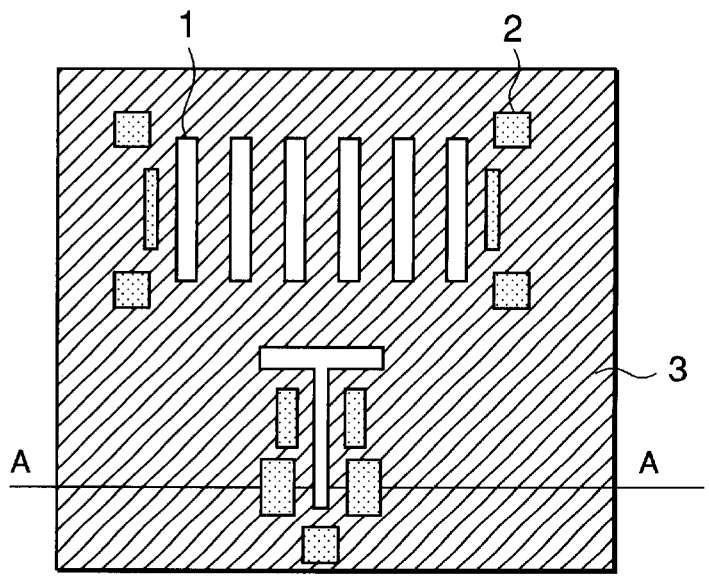
FIGS. 1A and 1B are plan and sectional views showing the construction of an electron beam drawing mask according to an embodiment of the present invention.
Figure 1B:
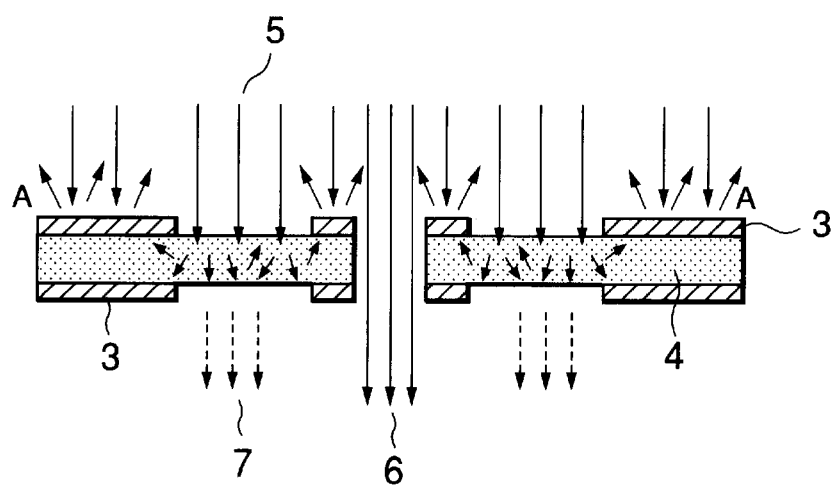
Figure 2:
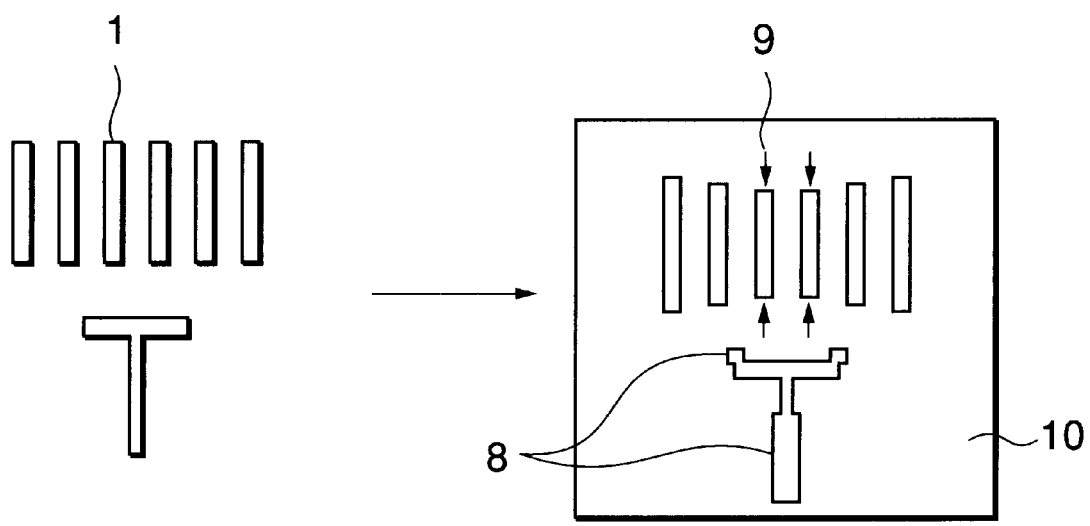
FIG. 2 illustrates a conventional electron beam drawing mask.

Hereinafter, an embodiment of the present invention will be described in detail with reference to FIGS. 1A and 1B. FIGS. 1A and 1B are views showing the construction of an electron beam drawing mask according to an embodiment of the present invention, wherein FIG. 1A is a plan view of the mask and FIG. 1B is a sectional view taken along line A—A in FIG. 1A.

First, a method of making the electron beam drawing mask of this embodiment will be briefly described. For provision of a pattern to be formed on a mask, a correcting calculation based on the accumulated energy distribution due to electron beam scattering is made in relation to a design data (data A), and thereby an auxiliary exposure pattern is produced for each region where the amount of exposure will be short due to proximity effect. The produced auxiliary exposure pattern is output as correcting data (data B). This correcting calculation may be made in a conventional manner.

Next, an electron beam stopper 3 made of a thin film of a heavy metal such as tungsten (W), gold (Au), or molybdenum (Mo) for interrupting an electron beam 5 is formed on either surface of a mask supporting substrate 4 made of a thin silicon film or the like.

This electron beam stopper 3 is not limited to such a thin film of a single metal, but it may be a multilayer film made of different metals. Besides, the stopper 3 preferably has electrical conductivity for preventing charge-up and heat accumulation upon irradiation with the electron beam.

After this, patterning on the mask is performed through the following two-step process. First, the auxiliary exposure pattern is made on the basis of the data B as the correcting data. At this time, the electron beam stopper 3 on either surface is partially removed to form auxiliary exposure windows 2 where the mask supporting substrate 4 is exposed. Next, patterning based on the data A as a device pattern 1 is performed. This device pattern 1 is constituted by stencil openings bored through the mask supporting substrate 4 and the electron beam stoppers 3 on both surfaces. In this manner, the electron beam drawing mask of this embodiment includes two types of openings, i.e., the stencil openings bored through the mask supporting substrate 4 and the electron beam stoppers 3, and the auxiliary exposure windows 2 where only the electron beam stoppers 3 have been removed.

A drawing method using the electron beam drawing mask thus made will be described with reference to FIG. 1. When this electron beam drawing mask is irradiated with the electron beam 5, the electron beam 5 completely passes through each stencil opening to form a main exposure transmitted beam 6, which reaches a resist on a wafer without any change. This main exposure transmitted beam 6 is used for drawing the device pattern 1.

Contrastingly, at where the mask supporting substrate 4 is coated with the electron beam stoppers 3, the electron beam 5 is completely scattered and it cannot pass through the mask at all. But, at the portion of each auxiliary exposure window 2 where the electron beam stoppers 3 have been removed, the electron beam 5 is scattered to a proper degree by the mask supporting substrate 4 made of the thin silicon film or the like. The energy accumulation by the electron beam 5 that reaches the resist on the wafer through this portion can thereby be smaller than the energy accumulation by the electron beam 5 that has passed through any stencil opening. Thus, the electron beam 5 having passed through this portion can be used as an auxiliary exposure scattered beam 7.

Any auxiliary exposure window 2 is never drawn by such an auxiliary exposure scattered beam 7, and proximity effect on the device pattern 1 can be effectively compensated. The degree of scattering the electron beam 5 at the portion of each auxiliary exposure window 2 depends on the energy of the electron beam, the material and thickness of the mask supporting substrate 4, and so on, which can properly be set at their optimum values.

As described above, the electron beam drawing mask of this embodiment comprises the stencil openings that allow the electron beam 5 for drawing to completely pass through, and the auxiliary exposure windows 2 for transmitting the scattered and damped electron beam 5. The main portion of the device pattern 1 is drawn with the stencil openings and where proximity effect should be compensated is drawn with each exposure window 2. By this construction, the electron beam drawing mask can be provided wherein any change in mask pattern such as re-sizing of design data itself is not required, and it is easy to perform the compare check of the mask and so the defect check can easily be performed. Besides, since the auxiliary exposure windows 2 are provided on the mask, separate auxiliary exposure is not required and so the throughput may not be lowered.

In this embodiment, an example of construction of the electron beam drawing mask has been described wherein metallic films as the electron beam stoppers 3 are formed on both surfaces of the mask supporting substrate 4, a thin silicon film is used as the mask supporting substrate 4, and tungsten or molybdenum is used for the metallic films as the electron beam stoppers 3. However, the present invention is not limited to the above-described embodiment. For example, also usable is a structure wherein an electron beam stopper 3 is formed only on one surface of the mask supporting substrate 4, or another sandwich structure wherein mask supporting substrates 4 of the same material or different materials are bonded to sandwich an electron beam stopper 3. Besides, the mask supporting substrate 4 may be made of another material that can properly scatter the electron beam. Also, the metallic film as the electron beam stopper 3 may be made of another material that does not allow the electron beam to pass through.

As described above, an electron beam drawing mask according to the present invention has the following effects.

As the first effect of the present invention, since the mask comprises at least one stencil opening that allows an electron beam to pass through, and at least one auxiliary exposure window provided near the stencil opening for scattering and damping the electron beam, proximity effect can be compensated without lowering the throughput, and thereby the dimensional accuracy upon drawing can be improved. Besides, since the electron beam is damped by scattering at the portion of the auxiliary exposure window, the auxiliary exposure window itself is never drawn. Therefore, the auxiliary exposure window need not be formed into a size less than the resolution limit.

As the second effect of the present invention, any change in mask pattern such as re-sizing of the design data itself is not required. Since the made mask has the same pattern as the design data, it is easy to perform the compare check of the pattern with the design data, and so the defect check can easily be performed.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. An electron beam drawing mask comprising:

a substrate for damping an electron beam to a predetermined quantity of electrons while said electron beam passes through said substrate;

a metallic film formed on at least one surface of said substrate for interrupting said electron beam;

a main pattern constituted by at least one opening bored through said substrate and said metallic film; and an auxiliary pattern formed near said main pattern and constituted by at least one window portion where said metallic film has been removed to expose said substrate.

2. The mask according to claim 1, wherein said main pattern and a metallic film in which the same pattern as said auxiliary pattern is formed are formed also on the surface of said substrate opposite to said one surface.

3. The mask according to claim 1, wherein said substrate includes a thin silicon film.

4. The mask according to claim 1, wherein said metallic film contains at least one selected from the group consisting of tungsten, molybdenum, and gold.

* * * * *